US012642021B2

(12) United States Patent
Hung et al.

(10) Patent No.: US 12,642,021 B2
(45) Date of Patent: May 26, 2026

(54) METHODS FOR PATTERNING SUBSTRATES TO ADJUST VOLTAGE PROPERTIES

(71) Applicant: Applied Materials, Inc., Santa Clara, CA (US)

(72) Inventors: Steven C. H. Hung, Sunnyvale, CA (US); Yixiong Yang, San Jose, CA (US); Tianyi Huang, Santa Clara, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 448 days.

(21) Appl. No.: 18/198,064

(22) Filed: May 16, 2023

(65) Prior Publication Data

US 2023/0402291 A1 Dec. 14, 2023

Related U.S. Application Data

(60) Provisional application No. 63/343,051, filed on May 17, 2022.

(51) Int. Cl.
H10P 32/20 (2026.01)
H10D 84/01 (2026.01)
(Continued)

(52) U.S. Cl.
CPC ......... H10P 32/20 (2026.01); H10D 84/0181 (2025.01); H10D 84/038 (2025.01);
(Continued)

(58) Field of Classification Search
CPC ........... H01L 21/3115; H01L 21/02183; H01L 21/02186; H01L 21/02192; H01L 21/0228;
(Continued)

(56) References Cited

U.S. PATENT DOCUMENTS

2011/0163385 A1 7/2011 Chidambarrao et al.
2019/0318967 A1* 10/2019 Chen .................... H10D 62/235
(Continued)

OTHER PUBLICATIONS

International Search Report and written opinion dated Sep. 6, 2023 for Application No. PCT/US2023/022318.

*Primary Examiner* — Christine S. Kim
*Assistant Examiner* — Nathalie R Fayette
(74) *Attorney, Agent, or Firm* — Patterson + Sheridan, LLP

(57) ABSTRACT

A method of adjusting a threshold voltage in a field-effect-transistor (FET) device includes performing a deposition process to deposit a diffusion barrier layer over a gate dielectric layer in a first region, a second region, and a third region of a semiconductor structure, performing a first patterning process to remove a portion of the deposited diffusion layer in the first region, performing a second patterning process to partially remove a portion of the deposited diffusion barrier layer in the second region, performing a dipole layer deposition process to deposit a dipole layer over the gate dielectric layer in the first region, and the diffusion barrier layer in the second region and in the third region, and performing an annealing process to drive dipole dopants from the dipole layer into the gate dielectric layer.

20 Claims, 7 Drawing Sheets

(51) Int. Cl.
     *H10D 84/03*          (2025.01)
     *H10P 14/60*          (2026.01)
     *H10P 14/692*         (2026.01)

(52) U.S. Cl.
     CPC .... *H10P 14/6339* (2026.01); *H10P 14/69393*
          (2026.01); *H10P 14/69394* (2026.01); *H10P*
                                 *14/69396* (2026.01)

(58) Field of Classification Search
     CPC ........ H01L 21/28176; H01L 21/28185; H10D
                 84/0181; H10D 84/038; H10D 30/60;
                     H10D 64/685; H10D 84/85; H10D
                 64/667; H10D 64/691; H10D 84/0165;
                 H10D 64/01338; H10D 64/0134; H10P
                 32/20; H10P 14/6339; H10P 14/69393;
                     H10P 14/69394; H10P 14/69396
     See application file for complete search history.

(56)                    References Cited

U.S. PATENT DOCUMENTS

| 2020/0035842 | A1* | 1/2020 | Kim ...................... H10D 84/83 |
| 2020/0176447 | A1 | 6/2020 | Pao et al. |
| 2021/0098581 | A1 | 4/2021 | Lin et al. |
| 2021/0104617 | A1 | 4/2021 | Hung et al. |
| 2021/0217884 | A1 | 7/2021 | Macelwee |
| 2021/0408229 | A1* | 12/2021 | More ................... H10D 64/513 |
| 2022/0262928 | A1* | 8/2022 | Chan ................. H10D 30/6735 |
| 2022/0310457 | A1* | 9/2022 | Chang ............... H10D 84/0144 |
| 2022/0328650 | A1* | 10/2022 | Tai ....................... H10D 64/017 |
| 2023/0207663 | A1* | 6/2023 | Lee ..................... H10D 64/017 |
|  |  |  | 257/288 |
| 2023/0261074 | A1* | 8/2023 | Bao ................... H10D 30/6757 |
|  |  |  | 257/288 |

* cited by examiner

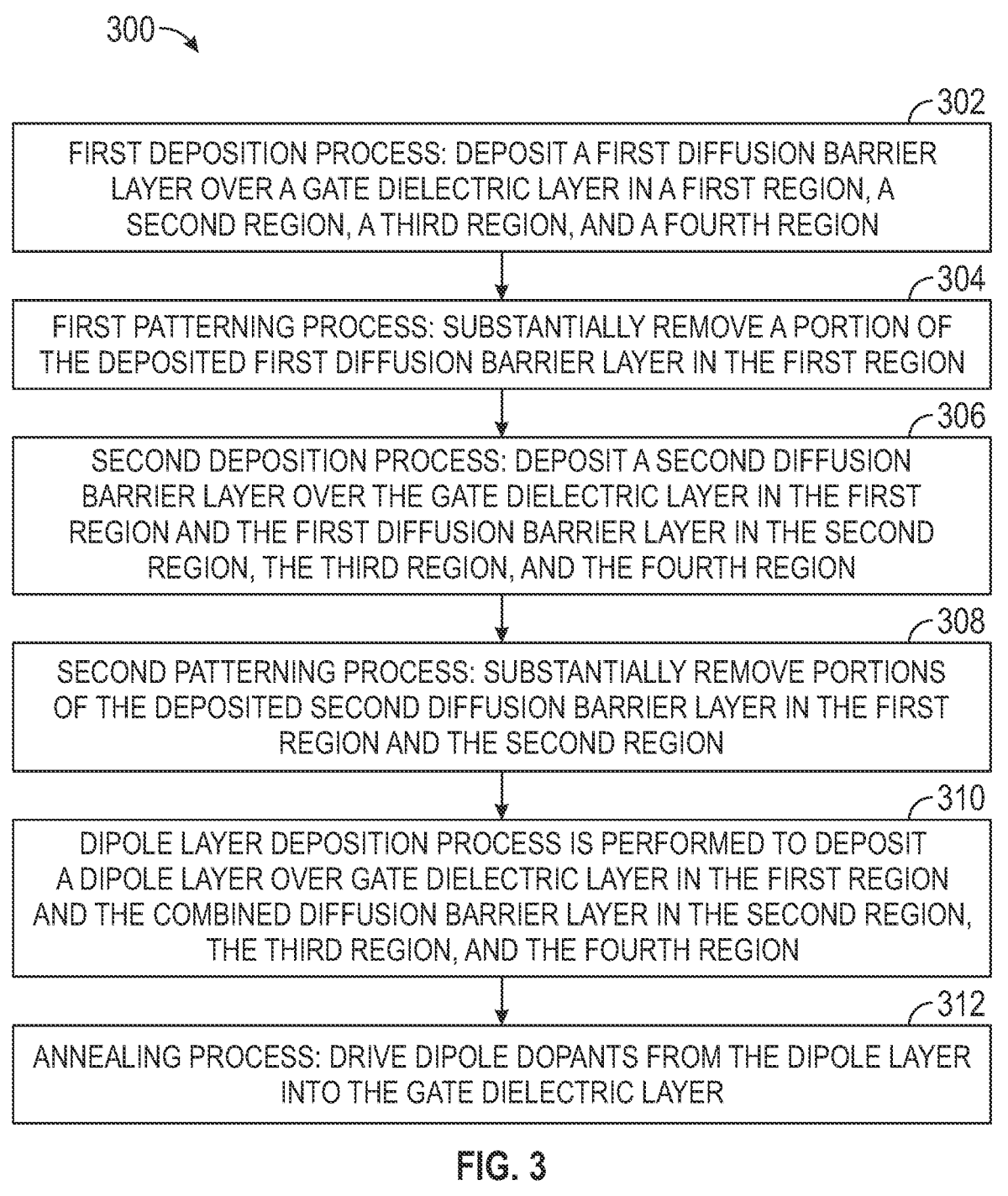

300

302

FIRST DEPOSITION PROCESS: DEPOSIT A FIRST DIFFUSION BARRIER LAYER OVER A GATE DIELECTRIC LAYER IN A FIRST REGION, A SECOND REGION, A THIRD REGION, AND A FOURTH REGION

304

FIRST PATTERNING PROCESS: SUBSTANTIALLY REMOVE A PORTION OF THE DEPOSITED FIRST DIFFUSION BARRIER LAYER IN THE FIRST REGION

306

SECOND DEPOSITION PROCESS: DEPOSIT A SECOND DIFFUSION BARRIER LAYER OVER THE GATE DIELECTRIC LAYER IN THE FIRST REGION AND THE FIRST DIFFUSION BARRIER LAYER IN THE SECOND REGION, THE THIRD REGION, AND THE FOURTH REGION

308

SECOND PATTERNING PROCESS: SUBSTANTIALLY REMOVE PORTIONS OF THE DEPOSITED SECOND DIFFUSION BARRIER LAYER IN THE FIRST REGION AND THE SECOND REGION

310

DIPOLE LAYER DEPOSITION PROCESS IS PERFORMED TO DEPOSIT A DIPOLE LAYER OVER GATE DIELECTRIC LAYER IN THE FIRST REGION AND THE COMBINED DIFFUSION BARRIER LAYER IN THE SECOND REGION, THE THIRD REGION, AND THE FOURTH REGION

312

ANNEALING PROCESS: DRIVE DIPOLE DOPANTS FROM THE DIPOLE LAYER INTO THE GATE DIELECTRIC LAYER

FIG. 3

METHODS FOR PATTERNING SUBSTRATES TO ADJUST VOLTAGE PROPERTIES

CROSS-REFERENCE TO RELATED APPLICATIONS

This application claims priority to U.S. Provisional Application Ser. No. 63/343,051 filed May 17, 2022, which is herein incorporated by reference in its entirety.

BACKGROUND

Field

Embodiments of the present disclosure relate to a method of processing substrates and, more specifically, to adjusting threshold voltages of portions of a field-effect-transistor (FET) device by forming an electrostatic dipole layer and adjusting a thickness of a diffusion barrier layer between the dipole layer and a gate dielectric layer.

Description of the Related Art

Semiconductor devices, such as an integrated circuit (IC), generally have electronic circuit elements, such as transistors, diodes, and resistors, fabricated integrally on a single body of semiconductor material. The various circuit elements are connected through conductive connectors to form a complete circuit, which can contain millions of individual circuit elements. Advances in semiconductor materials and processing techniques have resulted in reducing the overall size of the IC while increasing the number of circuit elements. Additional miniaturization is highly desirable for improved IC performance and cost reduction. Control of a threshold voltage Vt of transistors is important for use in various devices including gate modules and can be a challenge as gate lengths shrink.

Therefore, there is a need for methods of forming structures in FET devices and modulating threshold voltage in different regions of the FET devices.

SUMMARY

Embodiments of the present disclosure provide a method of adjusting a threshold voltage in a field-effect-transistor (FET) device. The method includes performing a deposition process to deposit a diffusion barrier layer over a gate dielectric layer in a first region, a second region, and a third region of a semiconductor structure, performing a first patterning process to remove a portion of the deposited diffusion layer in the first region, performing a second patterning process to partially remove a portion of the deposited diffusion barrier layer in the second region, performing a dipole layer deposition process to deposit a dipole layer over the gate dielectric layer in the first region, and the diffusion barrier layer in the second region and in the third region, and performing an annealing process to drive dipole dopants from the dipole layer into the gate dielectric layer.

Embodiments of the present disclosure provide a method of adjusting a threshold voltage in a field-effect-transistor (FET) device. The method includes forming a diffusion barrier layer on a gate dielectric layer, the diffusion barrier layer having a varying thickness in a first region, a second region, and a third region of a semiconductor structure, and performing a precision material engineering (PME) process on exposed surfaces of the semiconductor structure.

Embodiments of the present disclosure provide a method of forming a p-type field-effect-transistor (PFET) device and an n-type field-effect transistor (NFET) device. The method includes forming a first n-type dipole layer on a first gate dielectric layer formed on a silicon-germanium containing layer, the first n-type dipole layer having a varying thickness in a first region, a second region and a third region of a PFET device, forming a second n-type dipole layer on a second gate dielectric layer, the second n-type dipole layer having a varying thickness in a first region, a second region, and a third region of an NFET device, and performing an annealing process to drive dipole dopants from the first n-type dipole layer into the first gate dielectric layer and from the second n-type dipole layer into the second gate dielectric layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

FIG. 3 depicts a process flow diagram of a method for processing a substrate, according to some embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure provided herein include processes for forming structures in field-effect-transistor (FET) devices and tuning a threshold voltage of the structures for various uses. Threshold voltage tuning is achieved by depositing a dipole dopant containing layer over a gate dielectric layer and driving the dipole dopants into the underlying gate dielectric layer by annealing. The process further includes providing protective layers, hardmasks, and compatible etch chemistries to protect regions of the FET device in which the threshold voltage is not being modified. The process used herein is suitable for structures having thin individual layers, such as layers of about 20 Å or less, such as about 1 Å to about 10 Å.

Figure 1:
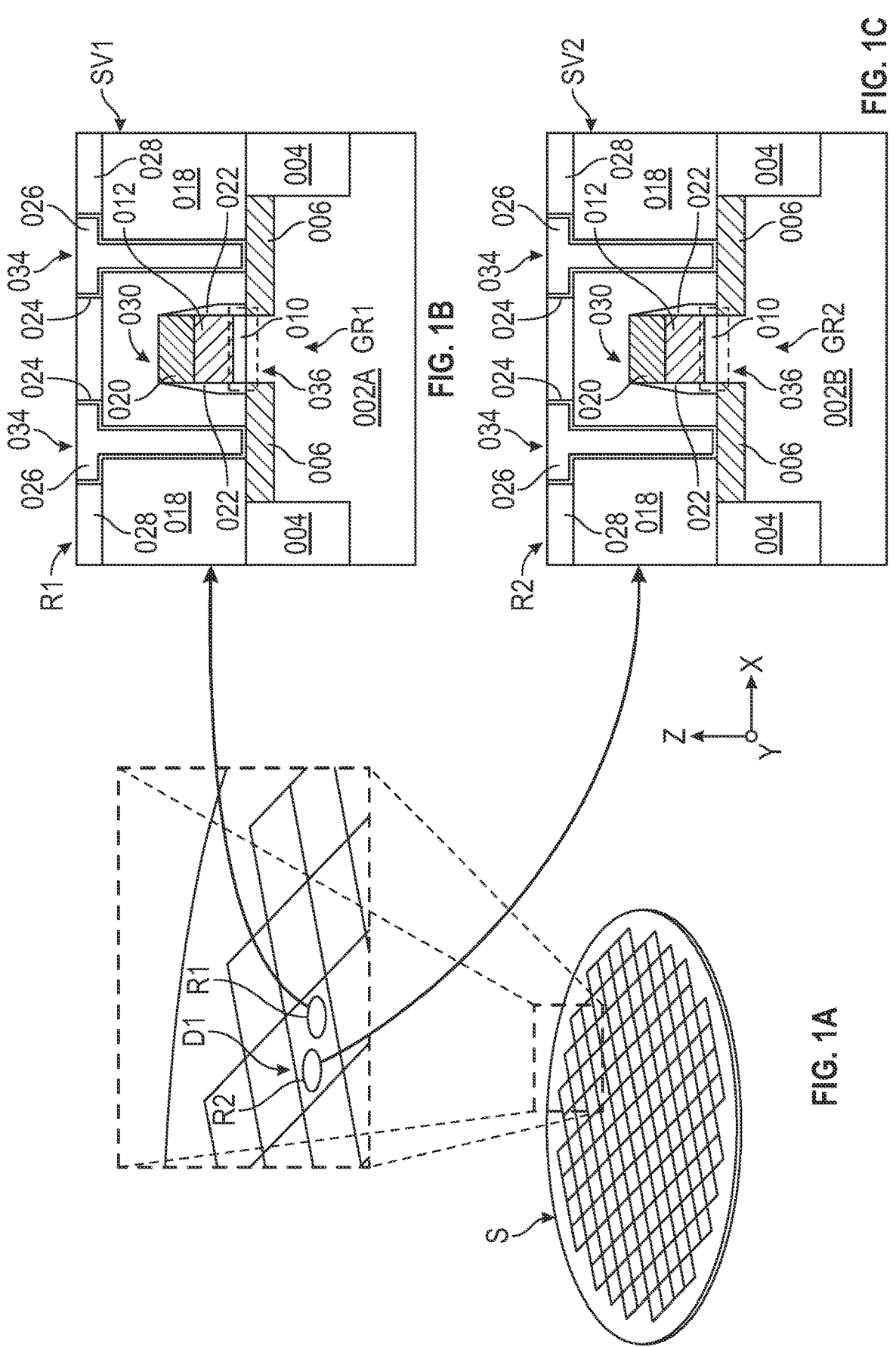
FIGS. 1A, 1B, and 1C depict a perspective view of a substrate and cross-sectional views of transistors disposed on the substrate, according to some embodiments.

FIGS. 1A, 1B, and 1C depict a perspective view of a substrate S and cross-sectional views of transistors disposed on the substrate S, according to some embodiments. The substrate S includes a die D1. The die D1 includes a first region R1 and a second region R2. A first sectional view SV1 of the first region R1 is shown in FIG. 1B, and a second sectional view SV2 of the second region R2 is shown in FIG. 1C. In some embodiments, the first region R1 is a p-type metal-oxide-semiconductor field-effect transistor (PMOS) device having a gate region GR1, and the second region R2 is an n-type metal-oxide-semiconductor field-effect transistor (NMOS) device having a gate region GR2. The first region R1 can include a transistor including a p-type well region 002A with an active region defined by isolation regions 004. The second region R2 is a transistor including an n-type well region 002B with an active region defined by isolation regions 004. Each of the first region R1 and the second region R2 may also include source/drain regions disposed within the active region. The source/drain regions may include doped n-type regions (e.g., n-type regions), including lateral portions 006 and a first inter-layer dielectric (ILD) layer 018. As shown, the lateral portions 006 of the source/drain regions may be laterally adjacent to a semiconductor channel 036 in the well regions 002A, 002B. The first ILD layer 018 may be any suitable dielectric material, such as silicon oxide ($SiO_2$), borophosphosilicate glass (BPSG), phosphosilicate glass (PSG), or the like. The first ILD layer 018 may be deposited by chemical vapor deposition (CVD), furnace chemical vapor deposition (FCVD), or another appropriate deposition process.

The first region R1 includes a gate structure 030, which may include the gate region GR1. Similarly, the second region R2 includes a gate structure 030, which may include the gate region GR2. Each of the gate structures 030 may include a gate oxide layer 010, a first gate metal layer 012, and optionally a second gate metal layer 020. In some embodiments, the gate structure 030 includes spacers 022.

The first region R1 and the second region R2 may include metal interconnect structures 034. A second ILD layer 028, which may be a similar material as the first ILD layer 018, may be deposited in the same or a similar manner over the first ILD layer 018. The layers used to form the metal interconnect structures 034 may be deposited in the recesses formed in the first ILD layer 018 and second ILD layer 028, such as by use of CVD, ALD, or physical vapor deposition (PVD). The metal interconnect structures 034 can include a conformal barrier layer 024, such as titanium nitride (TiN), tantalum nitride (TaN), or the like, and metal fill 026 on the barrier layer 024, such as tungsten (W), aluminum (Al), copper (Cu), or the like.

While FIGS. 1A, 1B, and 1C illustrate a configuration that includes commonly configured metal-oxide-semiconductor field-effect transistor (MOSFET) devices being formed within the substrate S, this configuration is not intending to be limiting as to the scope of the disclosure provided herein, since other types of formed device structures may benefit from one or more aspects of the disclosure provided herein. The more conventional types of devices structures illustrated herein are only presented to simplify the discussion of the processes performed herein. However, it is believed that the processes described herein will provide a significant advantage for configurations where the device that is to be formed is more structurally complex, such as multi-gate devices, which may include gate-all-around (GAA) FET devices and/or FinFET types of devices, and where conventional processing techniques (e.g., implantation) of various gate dielectric materials are not accessible due to the gate regions of these multi-gate devices being buried within many different layers of the device.

Figure 2:
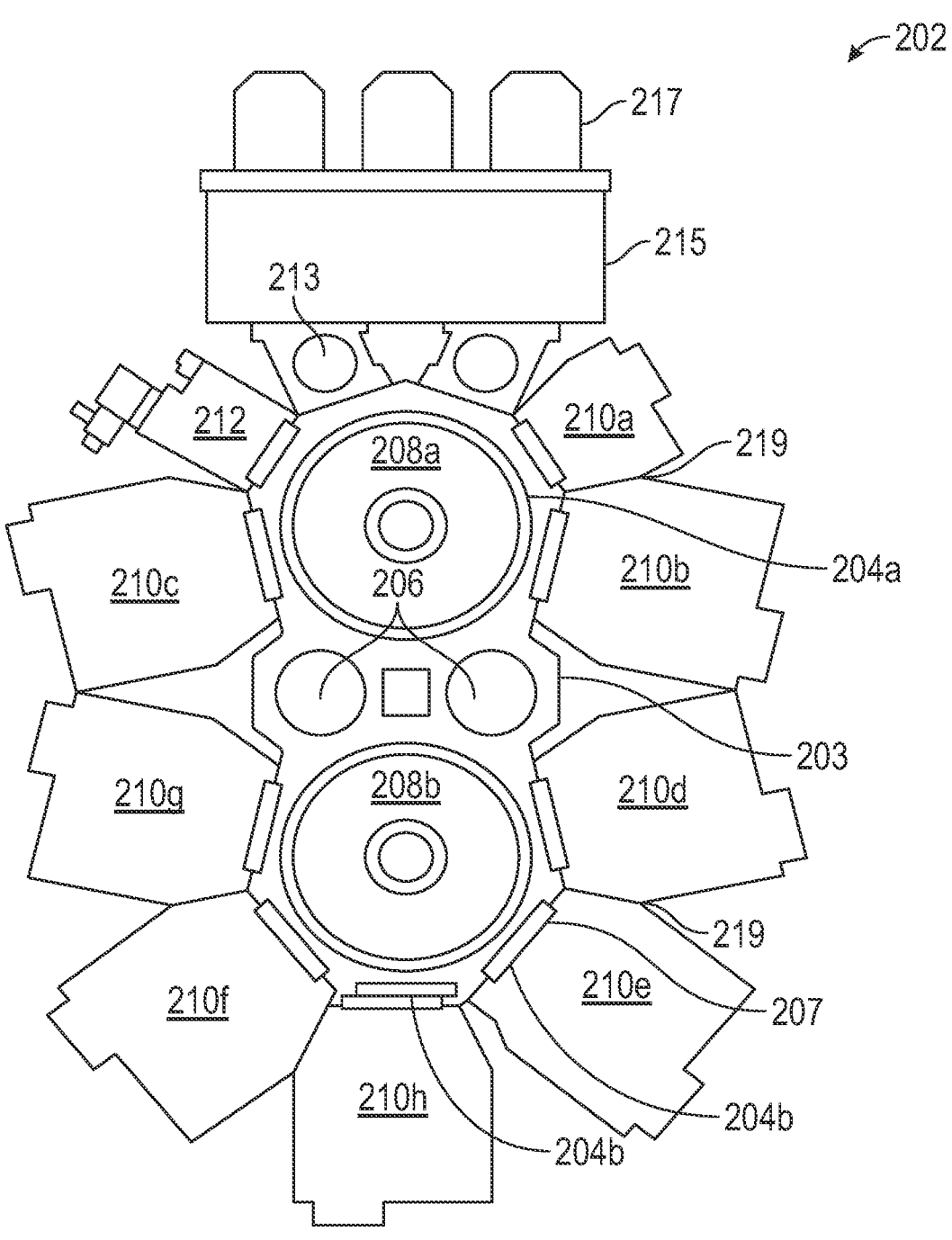
FIG. 2 illustrates a processing system that can be used to perform one or more of the processes described herein.

FIG. 2 illustrates a processing system 202 that can be used to perform one or more of the processes described herein. The processing system 202 disclosed herein may include an Endura® II mainframe or an Endura® III mainframe available from Applied Materials, Inc. of Santa Clara, California. processing system 202 includes a first transfer module 204a, a second transfer module 204b, and pass-through modules 206 connecting a first transfer chamber 208a of the first transfer module 204a to a second transfer chamber 208b of the second transfer module 204b. The first transfer module 204a includes a first process chamber 210a, a second process chamber 210b, a third process chamber 210c, an ancillary process chamber 212, and load lock chambers 213. The second transfer module 204b includes a fourth process chamber 210d, a fifth process chamber 210e, a sixth process chamber 210f, a seventh process chamber 210g, and an eighth process chamber 210h.

Each of the first transfer module 204a and the second transfer module 204b include a substrate handling robot (not shown) in the first transfer chamber 208a and the second transfer chamber 208b. The substrate handling robot of the first transfer module 204a is operable to transfer substrates between the load lock chambers 213, the first transfer chamber 208a, the process chambers 210a-210c, the ancillary process chamber 212, and the pass-through modules 206. The substrate handling robot of the second transfer module 204b is operable to transfer substrates between the pass-through modules 206, the second transfer chamber 208b, the process chambers 210d-210h. The processing system 202 includes load lock chambers 213 that are coupled to a factory interface 215. The factory interfaces 215 separately provides substrates to the processing system 202 via one or more factory interface (FI) robots (not shown) and front opening unified pods (FOUPs) 217.

Valves 207 are disposed at the interfaces of the process chambers 210a, 210b, 210c, the ancillary process chamber 212, and the load lock chambers 213 with the first transfer chamber 208a of the first transfer module 204a. The valves 207 are also disposed at the interfaces of the process chambers 210d, 210e, 210f, 210g, 210h with the second transfer chamber 208b of the second transfer module 204b. In one embodiment, which can be combined with other embodiments described herein, the valves 207 are slit valves and/or gate valves. Thus, the process chambers 210a-210h can be separately isolated from the first transfer chamber 208a and the second transfer chamber 208b. Vacuum pumps 219, such as cryopumps, turbopumps, or the like, may be coupled to the first transfer chamber 208a and the second transfer chamber 208b. The vacuum pumps 219 are operable to maintain the vacuum levels of the first transfer chamber 208a and the second transfer chamber 208b. The vacuum level may increase or decrease in each of the first transfer chamber 208a and the second transfer chamber 208b as one or more substrates are transferred between the first transfer chamber 208a and the second transfer chamber 208b.

In this configuration, the transfer of the substrates within the processing system 202 can be completed while the substrates are disposed within a high vacuum environment (e.g., $10^{-7}$-$10^{-9}$ Torr), since the vacuum level in the second transfer chamber 208b is maintained at a higher base pressure than the vacuum level maintained in the first transfer chamber 208a. Typically, the base pressure or vacuum level increases (i.e., lower pressure) as the substrate is moved through the first transfer module 204a to the second transfer module 204*b* within the processing system 202 in a direction from the load lock chambers 213 (e.g., $10^{-3}$ Torr) to the second transfer chamber 208*b* (e.g., $10^{-7}$-$10^{-8}$ Torr) and the process chambers 210*d*-210*g* (e.g., $10^{-8}$-$10^{-9}$ Torr).

The process chambers 210*a*-210*h* may be any type of process chambers such as deposition chambers, e.g., physical vapor deposition (PVD) chambers, chemical vapor deposition (CVD) chambers, plasma enhanced chemical vapor deposition (PECVD) chambers, atomic layer deposition (ALD) chambers, plasma enhanced atomic layer deposition (PEALD), etch chambers, degas chambers, and/or any other type of process chambers. The types of the process chambers 210*a*-210*h* are interchangeable in the processing system 202.

In one embodiment, the process chambers 210*d*, 210*e*, 210*f*, 210*g*, 210*h* are ALD chambers that are configured to deposit a dipole layer, such as p-type dipole layer. In this configuration, the process chambers 210*b* and 210*c* can include rapid thermal processing (RTP) chambers that are configured to heat substrates to drive the dipole layer with high-k dielectric layer. One or more of the process chambers 210*a* and 212 may be preclean chambers, such as an Aktiv™ Preclean ("APC") chamber available from Applied Materials, Inc. of Santa Clara, California. In another embodiment, one or more of the process chambers 210*d*, 210*e*, 210*f*, 210*g*, 210*h* are configured to deposit a diffusion barrier layer by an ALD process.

The processing system 202 includes a system controller 203 that receives data corresponding to the throughput of each of the process chambers 210*a*-210*h*. The system controller 203 is operable to apply predictive modeling to the data in order to provide instructions corresponding to process commands directed to processing in and transfer of one or more substrates from the process chambers 210*a*-210*h* of the processing systems 202. The system controller 203 may also provide an output corresponding to the optimal combination of PVD chambers, CVD chambers, PECVD chambers, ALD chambers, PEALD chambers, etch chambers, degas chambers, or any other type of process chambers for the process chambers 210*a*-210*h* of the processing system 202.

Figures 4, 5:
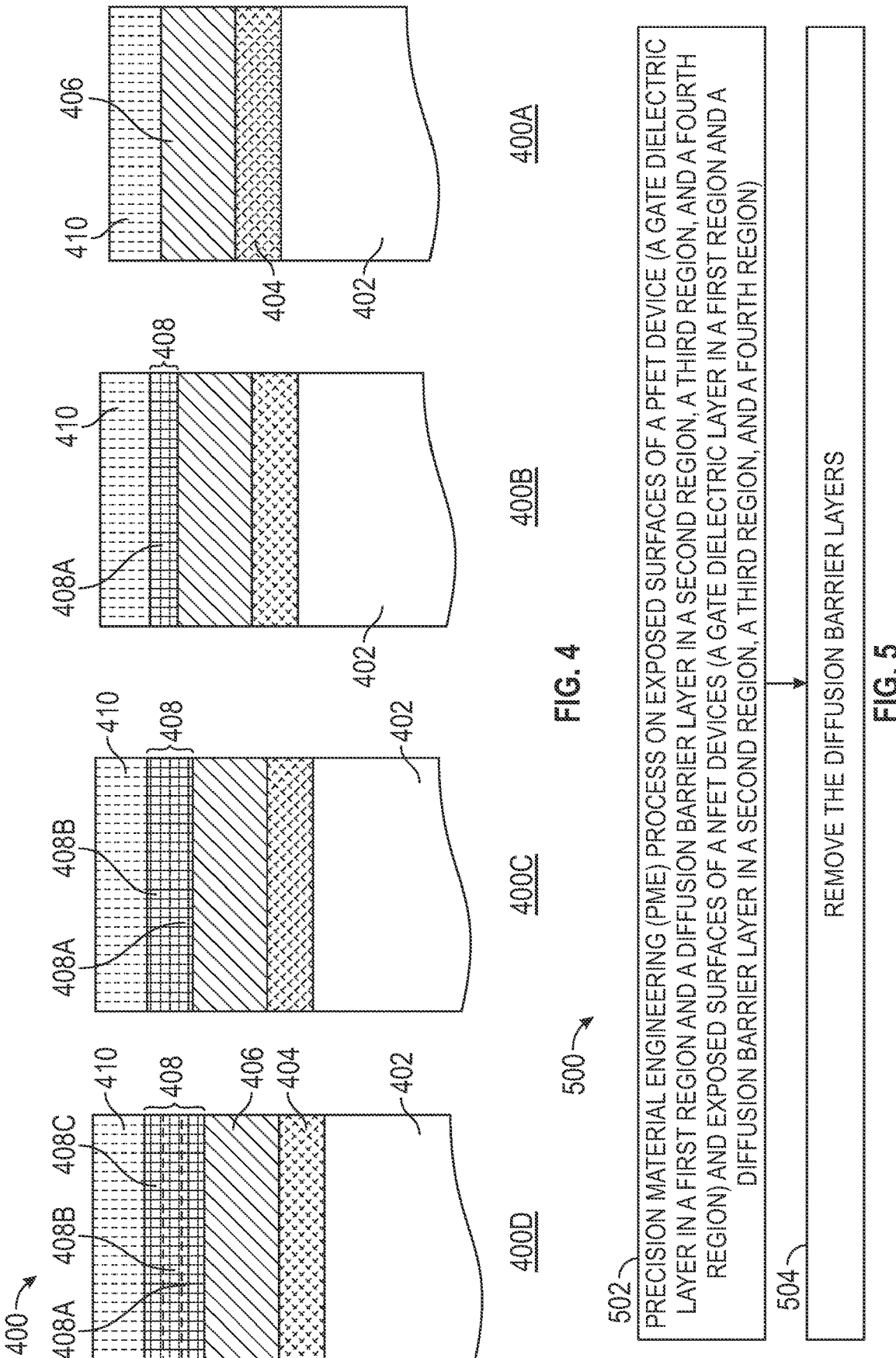
FIG. 4 depicts a substrate having a plurality of regions, according to some embodiments.
FIG. 5 depicts a process flow diagram of a method for processing a substrate, according to some embodiments.

FIG. 3 depicts a process flow diagram of a method 300 of altering characteristics of a gate dielectric layer used in a field-effect-transistor (FET) device in a semiconductor structure 400 shown in FIG. 4, according to some embodiments. In some embodiments, each of the layers deposited during the activities performed in the method 300 are deposited using atomic layer deposition (ALD) processes.

As shown in FIG. 4, the semiconductor structure 400 may include a first region 400A, a second region 400B, a third region 400C, and a fourth region 400D. Each of the regions 400A, 400B, 400C, and 400D include a substrate 402, an interfacial layer 404 formed on the substrate 402, and a gate dielectric layer 406 formed on the interfacial layer 404. The substrate 402 may be a silicon containing substrate (e.g., n-type Si substrate, p-type Si substrate). The interfacial layer 404 may be formed of silicon oxide ($SiO_2$).

The gate dielectric layer 406 may be formed of a high-k dielectric material. As used herein, a high-k dielectric material is a material having a dielectric constant greater than a dielectric constant of silicon oxide ($SiO_2$) (e.g., about 3.9). In some embodiments, the gate dielectric layer 406 is formed of a metal oxide. In some embodiments, the high-k dielectric material is a hafnium-containing material, a silicon containing material, a zirconium-containing material, a titanium-containing material, or combinations thereof. In some embodiments, the high-k dielectric material is a hafnium oxide containing material (e.g., $HfO_2$) or other suitable materials. The gate dielectric layer 406 is deposited at a thickness of about 20 Å or less, such as about 5 Å to about 15 Å. The gate dielectric layer 406 interfaces the interfacial layer 404. In one example, the gate dielectric layer 406 is formed over a channel region of a metal gate field-effect-transistor (FET) device, and the gate dielectric layer 406 includes an interfacial layer formed of silicon oxide ($SiO_2$) and a dielectric layer of hafnium oxide ($HfO_2$) formed thereon.

The method 300 begins with activity 302, in which a first deposition process is performed to deposit a first diffusion barrier layer 408A over the gate dielectric layer 406 in the first region 400A, the second region 400B, the third region 400C, and the fourth region 400D. The deposited first diffusion barrier layer 408A has a first diffusion barrier layer thickness of about 0 Å to about 15 Å, such as about 1 Å to about 10 Å, such as about 3 Å to about 5 Å. The diffusion barrier layer 408A may be formed of a metal nitride material, such as a titanium nitride (TiN), tantalum nitride (TaN), tungsten nitride ($W_2N$, WN, $WN_2$), or combinations thereof.

In activity 304, a first patterning process is performed to substantially remove a portion of the deposited first diffusion barrier layer 408A in the first region 400A. The first patterning process includes many processing steps, such one or more deposition steps, one or more lithography steps, one or more developing steps, and one or more etching steps. After performing the first patterning process, the portion of the deposited first diffusion barrier layer 408A in the first region 400A is substantially removed. The second region 400B, the third region 400C, and the fourth region 400D each includes a portion of the deposited first diffusion barrier layer 408A.

In activity 306, a second deposition process is performed to deposit a second diffusion barrier layer 408B over exposed surfaces of the semiconductor structure 400 (the gate dielectric layer 406 in the first region 400A and the first diffusion barrier layer 408A in the second region 400B, the third region 400C, and the fourth region 400D). The deposited second diffusion barrier layer 408B has a second diffusion barrier layer thickness of about 0 Å to about 15 Å, such as about 1 Å to about 10 Å, such as about 3 Å to about 5 Å. In one example, the second diffusion barrier layer 408B is formed of the same material as the first diffusion barrier layer 408A. The second deposition process in activity 306 may be the same deposition process as the first deposition process in activity 302.

In activity 308, a second patterning process is performed to substantially remove portions of the deposited second diffusion barrier layer 408B in the first region 400A and the second region 400B. The second patterning process includes many processing steps, such one or more deposition steps, one or more lithography steps, one or more developing steps, and one or more etching steps. After performing the second patterning process, the portions of the deposited second diffusion barrier layer 408B in the first region 400A and the second region 400B are substantially removed. The second region 400B includes a portion of the deposited first diffusion barrier layer 408A. The third region 400C and the fourth region 400D each include a portion of the first diffusion barrier layer 408A and a portion of the second diffusion barrier layer 408B.

Additional regions, such as the fourth region 400D, can further include a portion of an additional diffusion barrier layer, such as a third diffusion barrier layer 408C having a third diffusion barrier layer thickness of about 0 Å to about 15 Å, such as about 1 Å to about 10 Å, such as about 3 Å to about 5 Å, which can be formed by deposition and etch back (e.g., similar to activities 302 and 304) until the semiconductor structure 400 includes different regions with a diffusion barrier layer 408 having different diffusion barrier thicknesses. For example, a combined diffusion barrier layer 408 in the second region 400B is the first diffusion barrier layer 408A, and thus has a thickness equal to the first diffusion barrier layer thickness. The combined diffusion barrier layer 408 in the third region 400C is a combination of the first diffusion barrier layer 408A and the second diffusion barrier layer 408B, and thus has a thickness equal to a combined thickness of the first diffusion barrier layer thickness and the second diffusion barrier layer thickness. The combined diffusion barrier layer 408 in the fourth region 400D is a combination of the first diffusion barrier layer 408A, the second diffusion barrier layer 408B, and the third diffusion barrier layer 408C, and thus has a thickness equal to a combined thickness of the first diffusion barrier layer thickness, the second diffusion barrier layer thickness, and the third diffusion barrier layer thickness. In one example, the third diffusion barrier layer 408C is formed of the same material as the first diffusion barrier layer 408A and/or the second diffusion barrier layer 408B.

In some alternate embodiments, forming diffusion barrier layers 408 having varying thickness in different regions of the semiconductor structure 400 includes depositing a hardmask over the diffusion barrier layer 408, patterning the hardmask, and etching portions of the diffusion barrier layer 408 through openings of the patterned hardmask. For example, subsequent to the deposition of the hardmask over the diffusion barrier layer 408, an opening in the hardmask is formed in the first region 400A and then the diffusion barrier layer 408 in the first region 400A is etched. Subsequently, an opening in the hardmask is formed in the second region 400B and then the diffusion barrier layer 408 in the second region 400B is partially etched to a thickness of the first diffusion barrier layer 408A. Another opening in the hadmask is formed in the third region 400C and then the diffusion barrier layer 408 in the third region 400C is partially etched to a thickness of a combination of the first diffusion barrier layer 408A and the second diffusion barrier layer 408B. In some embodiments, the hardmask is formed of refractory metal nitride or carbide. The hardmask can be deposited over a protective layer disposed over the diffusion barrier layer 408. The hardmask is deposited to a thickness of about 10 Å to about 20 Å. Other processes and methods of depositing the diffusion barrier layer with varying thickness across various regions of the semiconductor structures 400 are also contemplated.

In activity 310, a dipole layer deposition process is performed to deposit a dipole layer 410 over gate dielectric layer 406 in the first region 400A and the combined diffusion barrier layer 408 in the second region 400B, the third region 400C, and the fourth region 400D. The dipole layer 410 includes dipole dopants. In general, dipole dopants include elements that form an electrostatic dipole, and are different from fixed charge types of dopants that include elements that form a positive or a negative charge due to the loss or gain of an electron when doped within a dielectric material. While not intending to be bound by theory, the presence of dipole dopants in a dielectric film is believed to lead to a surface potential at an interface of the gate dielectric layer 406, which leads to dielectric polarization in the dielectric film. The dielectric polarization caused by the presence of a desired amount of dipole dopants in a gate dielectric layer 406 can then be used to adjust a threshold voltage Vt of the FET device. A threshold voltage is the minimum gate-to-source voltage that is needed to create a conducting path between the source and the drain terminals. In some embodiments, it is desirable to dope different regions of the gate dielectric layer (e.g., metal gate interface surface, interface surface between a high-k layer and an interfacial dielectric layer, or channel interface surface) to further adjust the threshold voltage Vt of a FET. The dipole dopants in the dipole layer 410 can be a metal dopant, such as aluminum (Al) or lanthanum (La). The dipole layer provides the dipole dopants that is to be diffused into the gate dielectric layer 406 by subsequent annealing.

The dipole layer 410 has a dipole layer thickness of about 3 Å to about 10 Å, such as about 5 Å to about 8 Å. In some embodiments, the dipole layer 410 is formed of a metal nitride, such as titanium nitride that further includes dipole dopants.

In some embodiments, the dipole layer 410 has a uniform concentration of dipole dopants of about 1% to about 20%, such as about 5% to about 15%, such as about 8% to about 12% throughout the thickness of the dipole layer 410. Selecting the dipole dopant concentration in the dipole layer 410 is based on a predetermined final concentration of dipole dopants to be diffused into the gate dielectric layer 406. The predetermined concentration of dipole dopants to be diffused into the gate dielectric layer 406 is determined based on a predetermined threshold voltage Vt of at least one of the regions (e.g., 400A, 400B, 400C, 400D) or a predetermined difference in threshold voltage Vt of a FET device formed in one of the regions (e.g., 400A, 400B, 400C, 400D) relative to a FET device formed in another of the regions (e.g., 400A, 400B, 400C, 400D). In some embodiments, the dipole layer 410 has a substantially uniform concentration of dipole dopants within the dipole layer.

In some other embodiments, the dipole layer 410 has a gradient concentration of dipole dopants that varies along the thickness of the dipole layer 410, for example, a higher concentration at a surface of the dipole layer 410 closer to the gate dielectric layer 406 and a lower concentration at the opposite surface of the dipole layer 410. In some embodiments, the dipole dopants is formed by an atomic layer deposition (ALD) process. In some embodiments, a gradient concentration of the dipole dopants within the dipole layer 410 is formed by delivering ALD pulses that contain a dipole-dopant containing precursor with a concentration that is increasing every successive layer (i.e., positive gradient) or decreasing every successive layer (i.e., negative gradient) during the ALD process. In one example, about 70 at. % or more, such as about 80% or more, such as about 90% or more of the dipole dopants is disposed in a portion of the dipole layer 410 that is formed the surface of the dipole layer 410 closer to the gate dielectric layer 406, and such as a lower 50%, such as a lower 20% in the rest of the dipole layer 410 (i.e., negative gradient). In some embodiments, forming the gradient concentration of the dipole dopants includes increasing a time of exposure (e.g., pulse time) of the dipole dopants relative to a time of exposure of the other gases during the ALD process.

Without being bound by theory, it is believed that varying a thickness of the diffusion barrier layer 408 can control a dipole density at various regions of the semiconductor structure 400. In some embodiments, a diffusion barrier layer (not shown in FIG. 4) in the first region 400A is less than about 0.3 nm, such as 0 nm (thinnest), and the threshold voltage Vt shift is "ultra low." The diffusion barrier layer 408 of the second region 400B is about 0.3 nm to about 0.6 nm and the threshold voltage Vt is "low" and greater than the threshold voltage Vt of the first region 400A. The diffusion barrier layer 408 of the third region 400C is about 0.6 nm to about 1 nm and the threshold voltage Vt is "standard" and greater than the threshold voltage Vt of the second region 400B. The diffusion barrier layer 408 of the fourth region 400D is about 1 nm or greater (thickest) and the threshold voltage Vt is "high" and greater than the threshold voltage Vt of the third region 400C.

In activity 312, an annealing process is performed to drive dipole dopants from the dipole layer 410 into the gate dielectric layer 406. In some embodiments, the annealing process is performed at a temperature of about 600° C. to about 1100° C., such as about 800° C. to about 1000° C., or about 700° C. to about 950° C. In some embodiments, the annealing process is performed for a duration of about 0.5 seconds to about 15 seconds, such as about 1 second to about 10 seconds. Annealing the semiconductor structure 400 enables the dipole dopants from the dipole layer 410 to diffuse into the gate dielectric layer 406. Without being bound by theory, in one configuration, the dipole dopant diffused into the gate dielectric layer 406 produces a threshold voltage Vt shift in the gate dielectric layer 406 at an interface with the underlying interfacial layer 404 (e.g., silicon dioxide ($SiO_2$)) formed on the substrate 402. It has been discovered that selection of the dopant type and concentration enables modulation of the threshold voltage Vt either positively or negatively as compared to the threshold voltage Vt of an un-doped dielectric layer, depending on desired application. In some embodiments, the dipole dopant is a p-type dopant that is diffused into the gate dielectric layer 406 to induce negative polarization and lower threshold voltage Vt. In some embodiments, other dopants are contemplated to raise the threshold voltage Vt. It is further believed that the dipole dopant is diffused from the dipole layer 410 to the lower portion of the gate dielectric layer 406 (e.g., interface of the gate dielectric layer and the interfacial layer 404) and disturbs an oxygen density in the lower portion of the gate dielectric layer 406 (e.g., $HfO_2$) relative to the underlying interfacial layer 404 (e.g., silicon dioxide ($SiO_2$)).

After performing the activities of the method 300, additional steps may be performed to form FET devices that have differing and desirable threshold voltage Vt characteristics. In some embodiments, a first FET is formed that has a first threshold voltage Vt value. The first FET includes at least a portion of the dielectric layer found in the first region (e.g., the gate region GR1) after the semiconductor structure 400 was exposed to the annealing process. In some embodiments, a second FET is formed that has a second threshold voltage Vt value. The second FET includes at least a portion of the dielectric layer found in the second region (e.g., the gate region GR2) after the semiconductor structure 400 was exposed to the annealing process. The first threshold voltage Vt value is different from the second threshold voltage Vt value. Therefore, by adjusting the amount of the dipole dopant that is driven into the gate dielectric layer 406 during activity 312, due to the presence of the varying thicknesses of the diffusion barrier layer 408, the threshold voltage Vt value can be adjusted. In cases where the first, second, third and fourth regions form parts of a PMOS device the first region 400A typically has an ultra low threshold voltage Vt, the second region 400B has a low threshold voltage Vt, the third region 400C has a standard threshold voltage Vt, and the fourth region 400D has a high threshold voltage Vt.

Figures 6, 7:
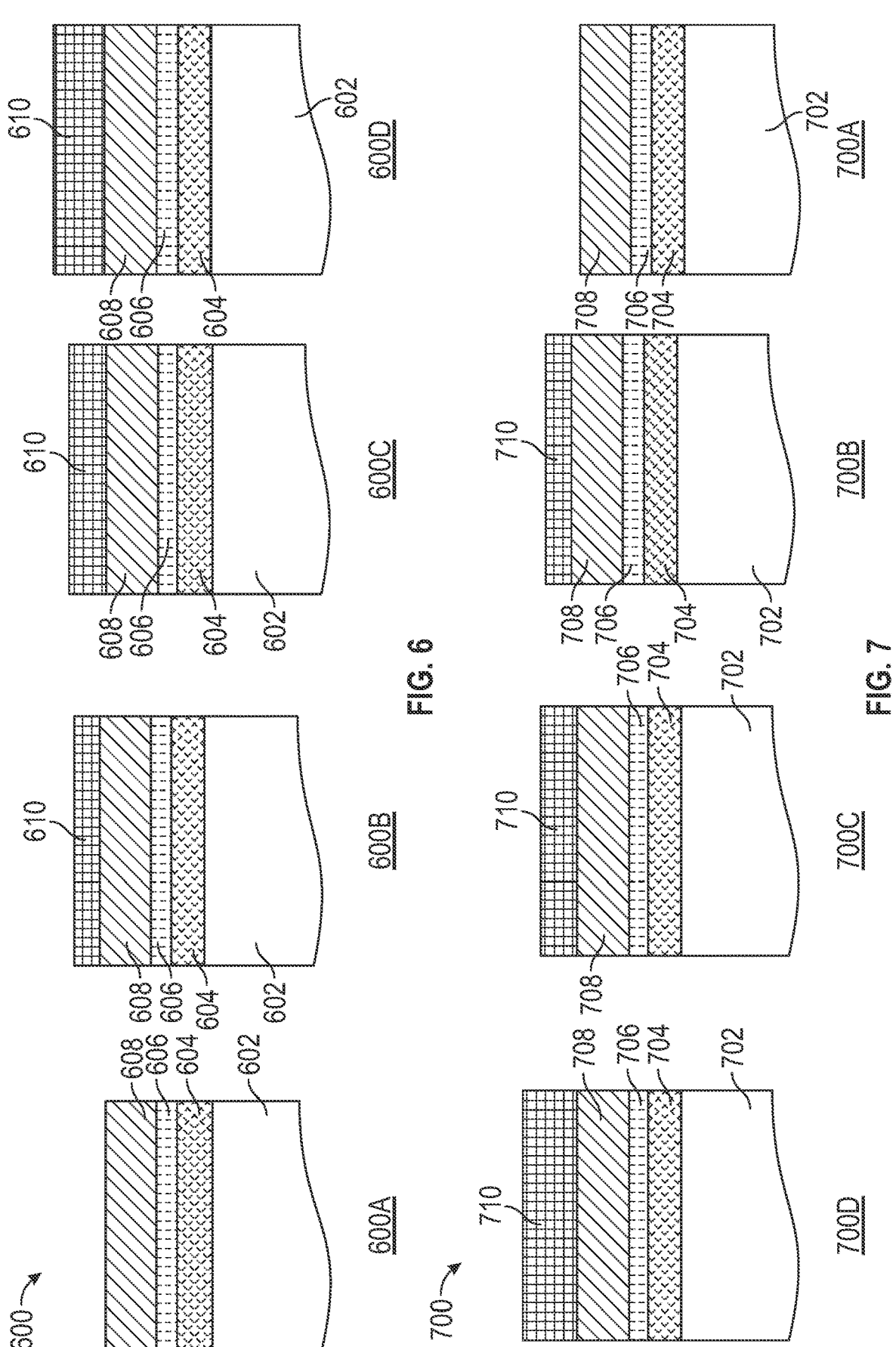
FIG. 6 depicts a p-type field-effect-transistor (PFET) device, according to some embodiments.
FIG. 7 depicts an n-type field-effect transistor (NFET) device, according to some embodiments.

FIG. 5 depicts a process flow diagram of a method 500 of altering the characteristics of a gate dielectric layer used in a PFET device 600 shown in FIG. 6 and a NFET device 700 shown in FIG. 7, according to some embodiments. The method 500 can be used for altering of the threshold voltage Vt in devices that include a dipole layer between an interfacial layer and a dielectric layer, without forming an additional dipole layer.

As shown in FIG. 6, the PFET device 600 includes a substrate 602, an interfacial layer 604 on the substrate 602, a p-type dipole layer 606 on the interfacial layer 604, and a gate dielectric layer 608 on the p-type dipole layer 606. As shown in FIG. 7, the NFET device 700 includes a substrate 702, an interfacial layer 704 on the substrate 702, an n-type dipole layer 706 on the interfacial layer 704, and a gate dielectric layer 708 on the n-type dipole layer 706. The interfacial layer 604 and the interfacial layer 704 may be formed of silicon oxide ($SiO_2$). The p-type dipole layer 606 may include p-type dipole dopants and have a thickness of about 3 Å to about 10 Å, such as about 5 Å to about 8 Å. The n-type dipole layer 706 may include n-type dipole dopants and have a thickness of about 3 Å to about 10 Å, such as about 5 Å to about 8 Å. The gate dielectric layer 608 and the gate dielectric layer 708 may be formed a high-k dielectric material and have a thickness of about 5 Å to about 15 Å.

A first region 600A of the PFET device 600 and a first region 700A of the NFET device 700 do not include diffusion barrier layers. A second region 600B of the PFET device 600 and a second region 700B of the NFET device 700 each include a diffusion barrier layer 610 and a diffusion barrier layer 710. A third region 600C of the PFET device 600 and a third region 700C of the NFET device 700 each include a thicker diffusion barrier layer 610 relative to the second region 600B and a thicker diffusion barrier layer 710 relative to the second region 700B. A fourth region 600D of the PFET device 600 and a fourth region 700D of the NFET device 700 each include a thicker diffusion barrier layer 610 relative to the third region 600C and a thicker diffusion barrier layer 710 relative to the third region 700C. The diffusion barrier layers 610 and 710 having varying thickness can be formed by a similar process to the method 300 as described above in relation to FIGS. 3 and 4.

The method 500 begins with activity 502, in which a precision material engineering (PME) process is performed on exposed surfaces of the PFET device 600 (the gate dielectric layer 608 in the first region 600A and the diffusion barrier layer 610 in the second region 600B, the third region 600C, and the fourth region 600D) and exposed surfaces of the NFET devices 700 (the gate dielectric layer 708 in the first region 700A and the diffusion barrier layer 710 in the second region 700B, the third region 700C, and the fourth region 700D). The PME process includes exposing the exposed surfaces of the PFET device 600 and the exposed surface of the NFET device 700 to a nitrogen containing species, such as a nitrogen radical. In some embodiments, the PME process is performed by use of a decoupled plasma nitridation (DPN) process that is available from Applied Materials.

In activity 504, after the PME process, the diffusion barrier layers 610 and 710 are removed.

Without being bound by theory, for PFET devices having a p-type dipole layer, such as the p-type dipole layer 606, the greater the thickness of the diffusion barrier layer 610, the lower the threshold voltage Vt of the region. In particular, the threshold voltage Vt of the first region 600A is higher than the second region 600B, which is higher than the third region 600C, which is higher than the fourth region 600D.

Without being bound by theory, for NFET devices having an n-type dipole layer, such as the n-type dipole layer 706, the greater the thickness of the diffusion barrier layer 710, the higher the threshold voltage Vt of the region. In particular, the threshold voltage Vt of the first region 600A is lower than the second region 600B, which is lower than the third region 600C, which is lower than the fourth region 600D.

In some embodiments, the PME process of the method 500 can be used for altering the characteristics of a gate dielectric layer in a PFET device 800 that is free of the dipole layer.

Figure 8:
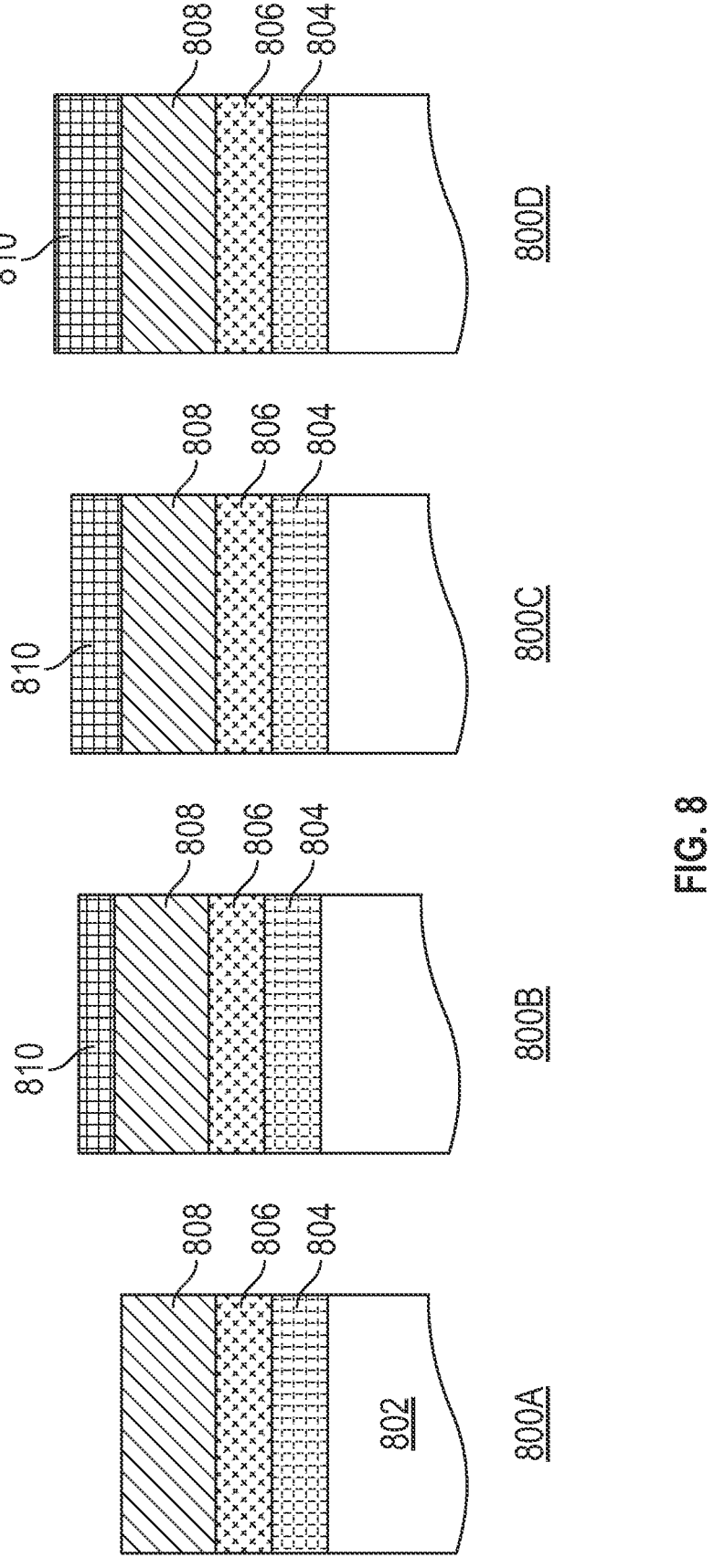
FIG. 8 depicts a PFET device, according to some embodiments.

As shown in FIG. 8, the PFET device 800 includes a substrate 802, a silicon-germanium containing layer 804 on the substrate 802, an interfacial layer 806 on the silicon-germanium containing layer 804, a gate dielectric layer 808 on the interfacial layer 806, and a diffusion barrier layer 810 on the gate dielectric layer 808. A first region 800A of the PFET device 800 does not include a diffusion barrier layer. A second region 800B of the PFET device 800 includes a diffusion barrier layer 810. A third region 800C of the PFET device 800 has a thicker diffusion barrier layer 810 relative to the second region 800B. A fourth region 800D of the PFET device 810 has the thickest diffusion barrier layer 810. The interfacial layer 806 has a thickness of about 3 Å to about 8 Å. The silicon-germanium containing layer 804 has a thickness of about 15 Å to about 25 Å. After performing a PME process (e.g., nitridation process) on exposed surfaces (the gate dielectric layer 808 in the first region 800A and the diffusion barrier layer 810 in the second region 800B, the third region 800C, and the fourth region 800D) of the PFET device 800, the threshold voltage Vt values decrease from the first region 800A to the fourth region 800D.

Figures 9, 10:
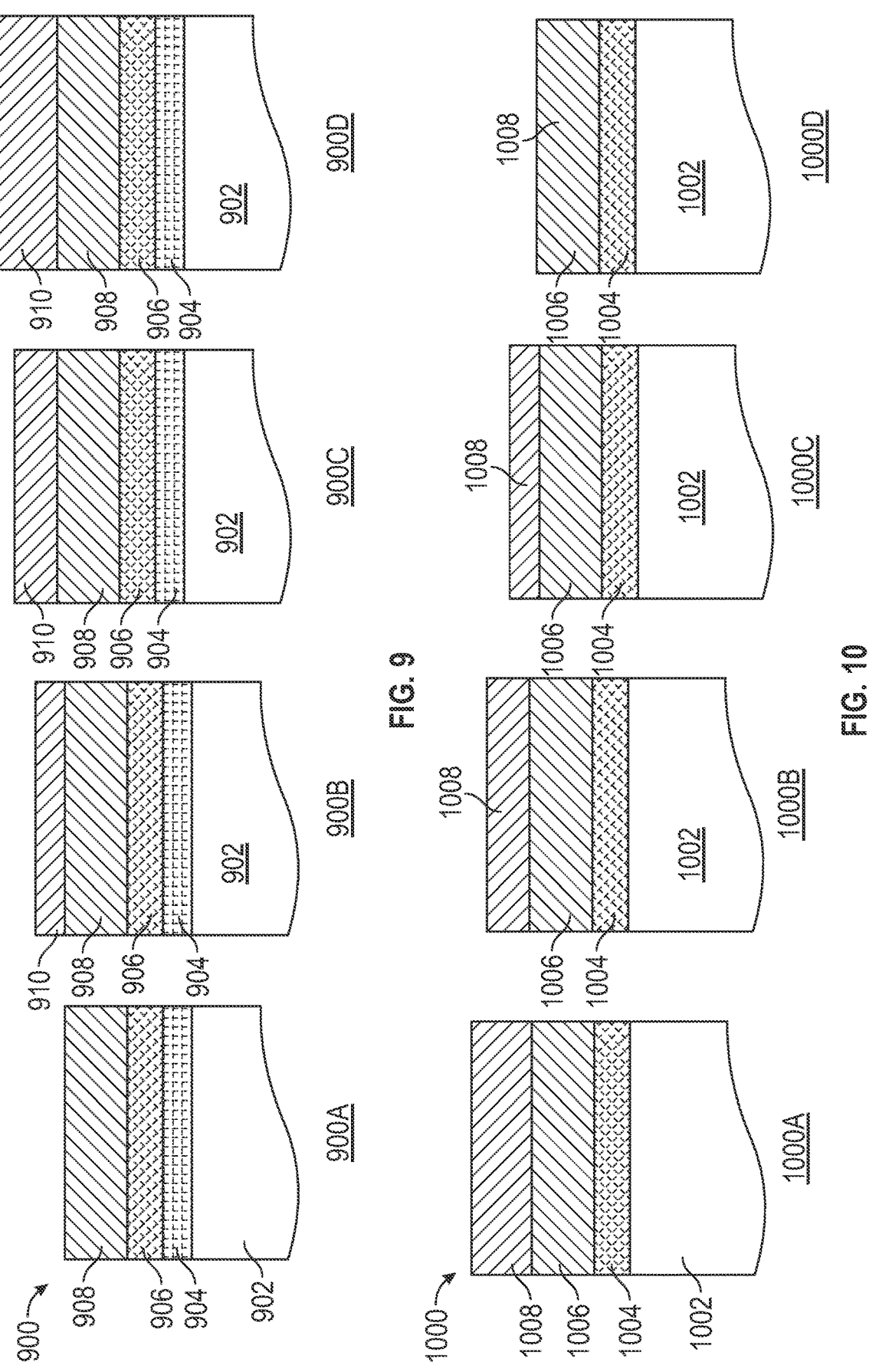
FIG. 9 depicts a PFET device, according to some embodiments.
FIG. 10 depicts an NFET device, according to some embodiments.

In some embodiments, forming an n-type dipole layer having varying thickness as in the method 300 can be used for altering the characteristics of a gate dielectric layer used in a PFET device 900 shown in FIG. 9 and a NFET device 1000 shown in Figure 10. The PFET device 900 includes a substrate 902, a silicon-germanium containing layer 904, an interfacial layer 906, a gate dielectric layer 908, and an n-type dipole layer 910. The NFET device 1000 includes a substrate 1002, an interfacial layer 1004, a gate dielectric layer 1006, and an n-type dipole layer 1008. The n-type dipole layer 910 and the n-type dipole layer 1008 may be formed of lanthanum oxide. For PFET device 900, the thicker the formed n-type dipole layer 910, the higher the threshold voltage Vt that will be realized by the different regions after an annealing process (e.g., RTP process) is performed to drive the dipole dopants from the n-type dipole layer 910 into the gate dielectric layer 908 and from the n-type dipole layer 1008 into the gate dielectric layer 1006. For the NFET device 1000, the thicker the n-type dipole layer 1008, the lower the threshold voltage Vt that will be realized by the different regions after the drive-in process is performed. The different thickness formed on each of the regions (both PMOS and NMOS) can be formed together during the process of forming each thickness on of the n-type dipole layer 910 on the substrate.

While the foregoing is directed to implementations of the present disclosure, other and further implementations of the present disclosure may be devised without departing from the basic scope thereof, and the scope thereof is determined by the claims that follow.

What is claimed is:

1. A method of adjusting a threshold voltage in a field-effect-transistor (FET) device, comprising:
   performing a first deposition process to deposit a first diffusion barrier layer over a gate dielectric layer in a first region, a second region, a third region, and a fourth region of a semiconductor structure;

performing a first patterning process to remove a portion of the deposited first diffusion barrier layer in the first region;
   performing a second deposition process to deposit a second diffusion barrier layer over the gate dielectric layer in the first region and the first diffusion barrier layer in the second region, the third region, and the fourth region;
   performing a second patterning process to partially remove a portion of the deposited second diffusion barrier layer in the first region and the second region;
   performing a third deposition process to deposit a third diffusion barrier layer over the gate dielectric layer in the first region, the first diffusion barrier layer in the second region, and the second diffusion barrier layer in the third region and the fourth region;
   performing a third patterning process to partially remove a portion of the deposited third diffusion barrier layer in the first region, the second region, and the third region;
   performing a dipole layer deposition process to deposit a dipole layer over the gate dielectric layer in the first region, the first diffusion barrier layer in the second region, the second diffusion barrier layer in the third region, and the third diffusion barrier layer; and
   performing an annealing process to drive dipole dopants from the dipole layer into the gate dielectric layer.

2. The method of claim 1, wherein each of the first diffusion barrier layer, the second diffusion barrier layer, and the third diffusion barrier layer comprises titanium nitride, tantalum nitride, or tungsten nitride and has a thickness of between 0 Å and 15 Å.

3. The method of claim 1, wherein the gate dielectric layer comprises a high-k dielectric material and has a thickness of between 5 Å and 15 Å.

4. The method of claim 1, wherein the dipole layer comprises dipole dopants and has a thickness of between 3 Å and 10 Å.

5. The method of claim 4, wherein the dipole layer has a uniform concentration of the dipole dopants of between 1% and 20% throughout the thickness of the dipole layer.

6. The method of claim 4, wherein the dipole layer has a gradient concentration of the dipole dopants that decreases along the thickness of the dipole layer from a surface of the dipole layer closer to the gate dielectric layer to the opposite surface of the dipole layer.

7. The method of claim 1, wherein each of the first deposition process, the second deposition process, and the third deposition process comprises an atomic layer deposition (ALD) process.

8. The method of claim 1, wherein the annealing process is performed at a temperature of between 600° C. and 1100° C. for a duration of 0.5 seconds to 15 seconds.

9. The method of claim 1, wherein
   the dipole layer is thinnest in the first region and thickest in the third region, and
   a threshold voltage shift as compared to an un-doped dielectric layer is lowest in the first region and highest in the third region.

10. A method of adjusting a threshold voltage in a field-effect-transistor (FET) device, comprising:
   forming a diffusion barrier layer on a gate dielectric layer, the diffusion barrier layer having a varying thickness in a first region, a second region, a third region, and a fourth region of a semiconductor structure, wherein the diffusion barrier layer in the second region is thicker than the diffusion barrier layer in the first region, the diffusion barrier layer in the third region is thicker than the diffusion barrier layer in the second region, and the diffusion barrier layer in the fourth region is thicker than the diffusion barrier layer in the third region; and performing a precision material engineering (PME) process on exposed surfaces of the semiconductor structure.

11. The method of claim 10, wherein the gate dielectric layer is formed on a dipole layer having a thickness of between 3 Å and 10 Å.

12. The method of claim 10, wherein the gate dielectric layer is formed on a silicon-germanium containing layer having a thickness of between 15 Å and 25 Å.

13. The method of claim 10, wherein the diffusion barrier layer comprises titanium nitride, tantalum nitride, or tungsten nitride and has a thickness of between 0 Å and 15 Å.

14. The method of claim 10, wherein the gate dielectric layer comprises a high-k dielectric material and has a thickness of between 5 Å and 15 Å.

15. The method of claim 10, wherein the diffusion barrier layer is thinnest in the first region and thickest in the third region.

16. A method of forming a p-type field-effect-transistor (PFET) device and an n-type field-effect transistor (NFET) device, the method comprising:

forming a first n-type dipole layer on a first gate dielectric layer formed on a silicon-germanium containing layer, the first n-type dipole layer having a varying thickness in a first region, a second region, and a third region of a PFET device;

forming a second n-type dipole layer on a second gate dielectric layer, the second n-type dipole layer having a varying thickness in a first region, a second region, and a third region of an NFET device; and performing an annealing process to drive dipole dopants from the first n-type dipole layer into the first gate dielectric layer and from the second n-type dipole layer into the second gate dielectric layer.

17. The method of claim 16, wherein the first n-type dipole layer and the second n-type dipole layer each comprises lanthanum oxide.

18. The method of claim 16, wherein the first gate dielectric layer and the second gate dielectric layer each comprises a high-k dielectric material and have a thickness of between 5 Å and 15 Å.

19. The method of claim 16, wherein the silicon-germanium containing layer has a thickness of between 15 Å and 25 Å.

20. The method of claim 16, wherein the annealing process comprises a rapid thermal processing (RTP) process.

* * * * *